US012811588B2

(12) United States Patent
Maung et al.

(10) Patent No.: US 12,811,588 B2
(45) **Date of Patent: *Nov. 24, 2026**

(54) DATA BUS SIGNAL CONDITIONER AND LEVEL SHIFTER

(71) Applicant: Texas Instruments Incorporated, Dallas, TX (US)

(72) Inventors: Win Naing Maung, Plano, TX (US); Bharath Kumar Singareddy, Bangalore (IN); Soumi Paul, New Delhi (IN); Mayank Garg, Ambala City (IN); Suzanne Mary Vining, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/792,708

(22) Filed: Aug. 2, 2024

(65) Prior Publication Data

US 2024/0396554 A1 Nov. 28, 2024

Related U.S. Application Data

(60) Continuation of application No. 17/700,045, filed on Mar. 21, 2022, now Pat. No. 12,088,293, which is a (Continued)

(51) Int. Cl.
*H04B 3/36* (2006.01)
*G06F 13/42* (2006.01)

(Continued)

(52) U.S. Cl.
CPC . *H03K 19/018521* (2013.01); *G06F 13/4282* (2013.01); *H04B 3/36* (2013.01); *H04L 7/0041* (2013.01); *H04L 25/0272* (2013.01)

(58) Field of Classification Search
CPC ....... H04B 3/36; G06F 13/382; G06F 13/385; G06F 13/387; G06F 13/4282;

(Continued)

(56) References Cited

U.S. PATENT DOCUMENTS 10,425,124 B1 9/2019 Wang et al.
10,509,756 B2 12/2019 Yamada (Continued)

OTHER PUBLICATIONS

PCT Search Report and Written Opinion received for Application No. PCT/US2021/017776, mailed May 28, 2021, 8 pages.

(Continued)

*Primary Examiner* — Betsy Deppe
(74) *Attorney, Agent, or Firm* — Xianghui Huang; Charles F. Koch

(57) ABSTRACT

A circuit includes signal conditioner circuitry, level shifter circuitry, and state detector and controller circuitry coupled between the signal conditioner circuitry and the level shifter circuitry. The state detector and controller circuitry includes receiver circuitry and a finite state machine coupled to the receiver circuitry. The finite state machine is configured to detect a first data rate from signals, control operation of the signal conditioner circuitry responsive to detecting the first rate, and control operation of the level shifter circuitry during a second data rate.

22 Claims, 7 Drawing Sheets

Related U.S. Application Data division of application No. 17/174,119, filed on Feb. 11, 2021, now Pat. No. 11,309,892.

(60) Provisional application No. 62/975,227, filed on Feb. 12, 2020.

(51) Int. Cl.

| | |
|---|---|
| ***H03K 19/0185*** | (2006.01) |
| ***H04L 7/00*** | (2006.01) |
| ***H04L 25/02*** | (2006.01) |

(58) Field of Classification Search

CPC ............ G06F 13/4004; G06F 13/4072; H04L 25/0264; H04L 25/0272; H04L 25/028; H04L 25/0292; H04L 7/0041; H03K 19/0175; H03K 19/017509; H03K 19/018507; H03K 19/018521

See application file for complete search history.

(56) References Cited

U.S. PATENT DOCUMENTS

| | | | | |
|---|---|---|---|---|
| 11,309,892 | B2 | 4/2022 | Maung et al. | |
| 12,088,293 | B2 * | 9/2024 | Maung | H04B 3/36 |
| 2007/0081598 | A1 | 4/2007 | Schoenborn | |
| 2014/0149609 | A1 | 5/2014 | Chan et al. | |
| 2015/0063337 | A1 | 3/2015 | Kang et al. | |
| 2015/0227489 | A1 | 8/2015 | Chen et al. | |
| 2017/0315946 | A1 | 11/2017 | Maung et al. | |
| 2018/0091333 | A1 | 3/2018 | Hafizi | |
| 2018/0287771 | A1 | 10/2018 | Srivastava et al. | |
| 2019/0280679 | A1 | 9/2019 | Iyer et al. | |

OTHER PUBLICATIONS

Partial Supplementary European Search Report, Application No. 21753174.8, dated Aug. 1, 2023.

* cited by examiner

DATA BUS SIGNAL CONDITIONER AND LEVEL SHIFTER

CROSS REFERENCE TO RELATED APPLICATIONS

This application is a continuation of U.S. patent application Ser. No. 17/700,045, filed Mar. 21, 2022, now U.S. Pat. No. 12,088,293, issued Sep. 10, 2024, which is a division of U.S. patent application Ser. No. 17/174,119, filed Feb. 11, 2021, now U.S. Pat. No. 11,309,892, issued Apr. 19, 2022, which claims priority to U.S. Provisional Application No. 62/975,227, filed Feb. 12, 2020, titled "Signal Conditioner/Level Shifter for eUSB2 interfaces," all of which are hereby incorporated herein by reference in their entireties.

TECHNICAL FIELD

This relates generally to data bus interfaces, and more particularly to a data bus signal conditioner and level shifter.

BACKGROUND

Data buses, including those compliant with one or more Universal Serial Bus (USB) industry standard specifications (generally referred to herein as USB), are widely used to facilitate communication between devices. The expansion of USB has resulted in a wide variety of USB compliant devices with varying communication and power requirements. For example, embedded USB industry standard specifications (generally referred to herein as eUSB2) enable reduced power communication between devices, such as integrated circuits (ICs) or chips mounted on a circuit board or included in an assembly within a computer system. However, although eUSB2 allows for serial communication between devices at reduced voltages, additional mechanisms are needed to support continued communication between devices as device feature size decreases and the distance between devices on a circuit board or other assembly increases.

For example, some standards recommend that certain buses be implemented so that the bus is shorter than a specified maximum length. Buses that are longer than the specified maximum length cause the data exchanged over the bus to be degraded. In addition, supply (such as voltage supplies and ground) limitations may factor into the specified maximum length of a bus. To facilitate greater bus lengths, some standards specify what types of repeaters may be used (e.g. the hybrid repeater specified by eUSB2). However, such repeaters require complex state machines and may degrade the data passing through the repeater. In addition, the specified repeaters require higher power.

SUMMARY

In one example, a circuit includes signal conditioner circuitry, level shifter circuitry, and state detector and controller circuitry coupled between the signal conditioner circuitry and the level shifter circuitry. The state detector and controller circuitry includes receiver circuitry and a finite state machine coupled to the receiver circuitry. The finite state machine is configured to detect a first data rate from signals, control operation of the signal conditioner circuitry responsive to detecting the first data rate, and control operation of the level shifter circuitry during a second data rate.

In another example, an intermediary circuit is adapted to be coupled between first and second communication devices using first and second conductors and is operable to facilitate communications between the first and second communication devices. The intermediary circuit includes a state detector and controller circuit having first and second outputs and adapted to be coupled to the first and second conductors. The intermediary circuit also includes a signal conditioning circuit coupled to the first output and adapted to be coupled to the first and second conductors, and a level shifter coupled to the second output and adapted to be coupled to the first and second conductors. The state detector and controller circuit is configured to: detect a state of communication; enable the signal conditioning circuit responsive to detecting a first state of communication; and enable the level shifter during a second state of communication. For example, the first state of communication is a high-speed data rate, and the second state of communication is a low-speed data rate or a full-speed data rate.

In another example, a system includes a first integrated circuit, a second integrated circuit, and an intermediary circuit coupled between the first and second integrated circuits. The intermediary circuit includes first switches, signal conditioner circuitry configured to boost edges of signals during a state in which the first switches are closed, second switches, level shifter circuitry operable during a state in which the second switches are closed, and state detector and controller circuitry. The state detector and controller circuitry includes receiver circuitry and a finite state machine coupled to the receiver circuitry. The finite state machine is configured to detect, from signals received at the receiver circuitry, a first data rate, close the first switches responsive to detecting first data rate, and close the second switches during a second data rate.

In another example, a method includes receiving signals and detecting, from the signals, a first data rate. The method further includes operating signal conditioner circuitry responsive to detecting the first data rate, for boosting edges of the signals; and operating level shifter circuitry during a second data rate, for shifting a voltage level of the signals from a first voltage level to a second voltage level.

BRIEF DESCRIPTION OF THE DRAWINGS

The same reference numbers are used in the drawings to depict the same or similar (such as, structure and/or function) features. The features in the drawings are not necessarily drawn to scale.

DETAILED DESCRIPTION OF EXAMPLE EMBODIMENTS

Figure 1:
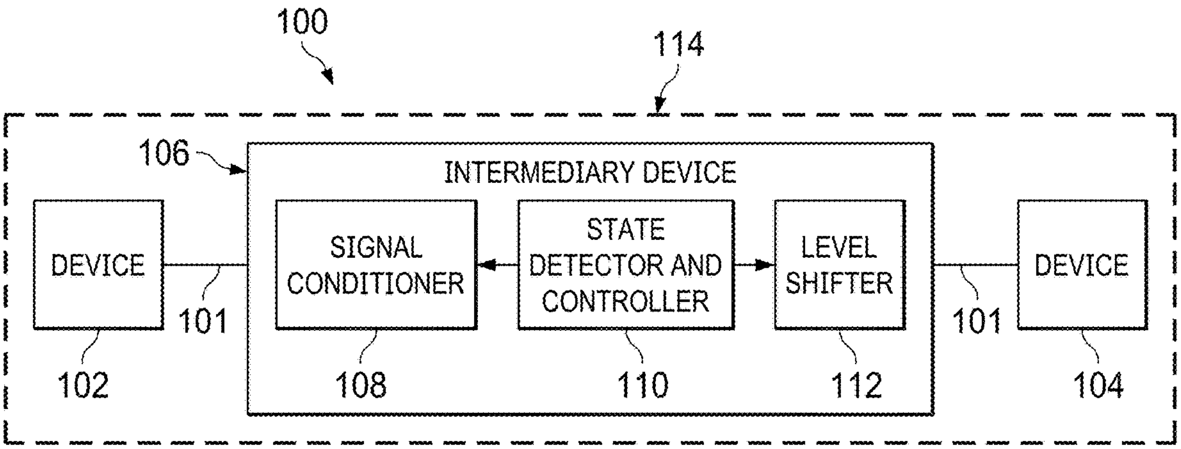
FIG. 1 is a block diagram depicting an example system having an intermediary device that includes a signal conditioner, a level shifter, and state detector and controller circuitry.

In the drawings, like reference numerals refer to like elements throughout, and the various features are not necessarily drawn to scale. In the description and in the claims, the terms "including" and "having" and variants thereof are intended to be inclusive in a manner similar to the term "comprising" unless otherwise noted. In addition, the terms "couple", "coupled" or "couples" means an indirect or direct electrical or mechanical connection.

In some described examples, an intermediary device is used between two devices and/or buses. The intermediary device in some examples uses a simplified state machine that doesn't utilize protocol handshakes that are dictated by some bus standards (such as eUSB2). For instance, the intermediary devices include receiver circuitry that senses voltages, responsive to which the state machine, e.g. a digital finite state machine, controls operation of signal conditioning circuitry and level shifter circuitry. In some examples, the signal conditioning includes edge boosting instead of repeating packets. Moreover, in examples, the level shifter circuitry enables communication between devices that operate at different voltage supply levels and ground levels.

Referring initially to FIG. 1, which is a block diagram depicting a system 100 in accordance with the described examples. System 100 includes two devices 102 and 104 and an intermediary device 106. In one example, the devices 102-106 are included in or on a same physical arrangement or assembly 114. For instance, the physical arrangement 114 is a computer system such as a laptop, desktop, cell phone, tablet, wearable device, television, or monitor. In another example, the physical arrangement 114 is a circuit board, such as a printed circuit board (PCB). Moreover, although only two devices 102 and 104 and one intermediary device 106 are shown, there may be additional such devices included in the system 100.

Devices 102 and 104 can communicate over a data bus 101 (also referred to herein as a bus 101) using a communication protocol and are therefore also referred to herein as communication devices. For instance, the bus 101 may include one or more conductors for transferring signaling or signals between devices 102 and 104. Moreover, a conductor may include one or more electrical traces or other type of signal line. In some examples, the conductors of the bus 101 terminate at the intermediary device 106, for instance at the level shifter circuitry 112, such that devices 102 and 104 do not have a direct electrical connection. In other examples, the conductors of the bus 101 flow through the intermediary device 106, for instance at the signal conditioner circuitry 108, such that the devices 102 and 104 may maintain a direct electrical connection.

In another example, the devices 102 and 104 include circuitry (not shown) that enables serial communication over the bus 101 using a communication protocol defined by, consistent with, and/or compliant with eUSB2, for instance the Embedded USB2 (eUSB2) Physical Layer Supplement to the USB Revision 2.0 Specification, Revision 1.1, or an earlier or later eUSB2 specification, which is herein incorporated by reference. Devices that can communicate using the protocol defined by, consistent with, and/or compliant with eUSB2 are referred to as eUSB2 devices, and buses, cables or other electrical connections that provide such communications between eUSB2 devices are referred to as eUSB2 buses.

Examples of devices 102 and 104 include an IC or packaged system such as a system-on-chip (SoC), a data storage or memory device, an eUSB2 repeater, etc. Moreover, as eUSB2 devices, the devices 102 and 104 may include circuitry (not shown) to communicate in native mode when neither of the devices 102 nor 104 is a eUSB2 repeater or in repeater mode when one of the devices 102 or 104 is a eUSB2 repeater.

The intermediary device 106 facilitates the communication between devices 102 and 104 over the bus 101. The intermediary device 106 includes signal conditioner (or conditioning) circuitry 108, state detector and controller circuitry 110, and level shifter circuitry 112 (or simply a level shifter 112). The components or elements 108-112 of the intermediary device 106 may be included on a single semiconductor substrate (and packaged in a single semiconductor package), multiple semiconductor substrates (and packaged in a single semiconductor package as a single IC) or in multiple IC packages and included as a module, separate from the devices 102 and 104.

The state detector and controller circuitry 110 monitors the signaling, e.g., one or more signals or sequences of signals such as is included in one or more eUSB2 packets and/or control commands or messages, on bus 101. The state detector and controller circuitry 110 then detects a state of the communication on the bus 101 (also referred to herein as a bus state or simply as a state) from the signaling. Moreover, depending on the detected state, the state detector and controller circuitry 110 controls, e.g., enables or disables, operation of the signal conditioner circuitry 108 and/or the level shifter circuitry 112.

In order to monitor the signaling on the bus 101 and detect the bus state, the state detector and controller circuitry 110 includes receiver circuitry (not shown) coupled to the bus 101 to receive the signaling and one or more finite state machines (not shown) to detect the bus state from the received signaling. The detected state may include or indicate port configurations upon startup, a data (e.g., bit) rate or other data communication speed used for the communication, suspension or resumption of communication, entry into or exit from a low power mode or other power management state, reset of a device on the bus, device connect or disconnect, etc.

In one example, upon detecting a first data rate, for instance an eUSB2 high-speed data rate, the state detector and controller circuitry 110 enables the signal conditioner circuitry 108 and disables the level shifter circuitry 112. Conversely, upon detecting a second data rate, for instance an eUSB2 low-speed or full-speed data rate, the state detector and controller circuitry 110 disables the signal conditioner circuitry 108 and enables the level shifter circuitry 112. In another example, upon detecting a low power mode or state, for instance an eUSB2 L1 power state (also referred to herein as a L1 state), the state detector and controller circuitry 110 causes the intermediary device 106 to enter into a low power mode or state by disabling all or part of the signal conditioner circuitry 108. The intermediary device 106 may also disable all or part of the level shifter circuitry 112 while in the low power mode or state. Entry into the low power mode enables power savings.

The level shifter circuitry 112 translates signals on the bus 101 from one logic level or voltage domain to another between the devices 102 and 104. In an example, the level shifter circuitry 112 translates signals at the bit level, e.g., one bit at a time, without using re-timer circuitry and is thus also referred to herein as a "bit-level repeater." This allows communication between the devices 102 and 104, including two eUSB2 devices, over the bus 101 when the devices have different supply and ground levels, with a benefit of being protocol agnostic, meaning irrespective of the communication protocol used between the devices. This is contrary to a eUSB2 hybrid repeater, which requires: ports that comply with eUSB2 definitions, re-timer and full clock and data recovery (CDR) circuitry, and the capability to perform as a "packet-level repeater" by translating entire packets and translating control commands or messages between eUSB2 devices. Thus, the bit-level repeaters described herein can beneficially be implemented with less complexity, and related cost, than the eUSB2 hybrid repeater.

A further benefit of the level shifter circuitry 112 is that it can enable communication between devices 102 and 104 as one or more feature sizes of the components (e.g., transistors) of the devices shrinks. For example, eUSB2 currently supports devices operating at 1.2 and 1.0 Volts (V) (e.g., supporting 5 nanometer (nm) process nodes), between which the level shifter circuitry 112 can directly translate signals between two eUSB2 devices at the bit level. As feature sizes shrink, e.g., for 3 nm and 2 nm process nodes and beyond with associated lower voltage domains such as 0.8 V, the level shifter circuitry 112 can translate signals between additional voltage domains. This beneficially allows use of the intermediary device 106 to support eUSB2 device-to-eUSB2 device bit-level translation as eUSB2 expands to accommodate lower voltage domains.

The signal conditioner circuitry 108 includes signal booster circuitry (not shown) that boosts the power of the signaling on the bus 101, again without the complexity of performing as a packet repeater. In an example, the signal conditioner circuitry 108 conditions the signals on the bus 101 during eUSB2 high-speed signaling by detecting the edges of differential signals on the bus 101 and injecting differential current onto the bus 101. Injecting current onto the bus 101 may increase the rate of edge transition and, correspondingly, decrease the transition time of the edges on the bus 101, which improves the eye pattern of the signals and allows the length of the bus 101 to be increased. Accordingly, the signal conditioner circuitry 108 may beneficially overcome the limitation of a maximum trace length of 10 inches between two eUSB2 devices to satisfy the eye pattern constraints defined in the eUSB2 specifications. Use of a longer bus is beneficial in some applications where larger circuit board sizes or flex cable connections are desired.

Figure 2:
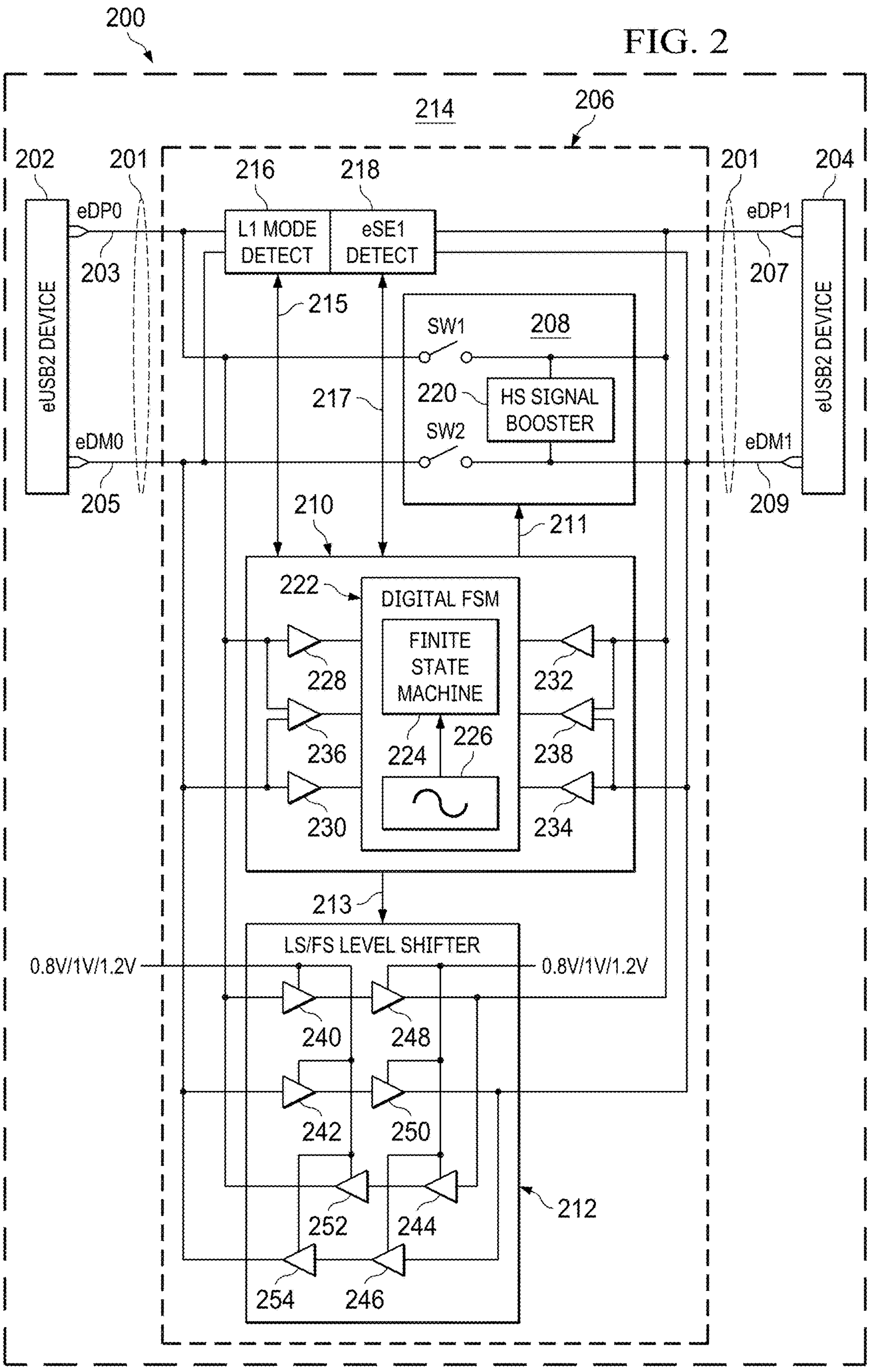
FIG. 2 is a schematic diagram depicting an example eUSB2 system having an intermediary device that includes a signal conditioner, a level shifter, and state detector and controller circuitry.

FIG. 2 depicts an eUSB2 system 200 in accordance with the described examples. System 200 is an example implementation of system 100 of FIG. 1. System 200 includes two eUSB2 devices 202 and 204 and an intermediary device 206. eUSB2 devices 202 and 204 are example implementations of devices 102 and 104, and intermediary device 206 is an example implementation of the intermediary device 106.

In one example, the devices 202-206 are included in or on a same physical arrangement or assembly 214. For instance, the physical arrangement 214 is a computer system such as a laptop, desktop, cell phone, tablet, wearable device, television, or monitor. In another example, the physical arrangement 214 is a circuit board, such as a PCB. Moreover, although only two eUSB2 devices 202 and 204 and one intermediary device 206 are shown, there may be additional such devices included in the system 200. Moreover, the eUSB2 devices 202 and 204 may each be included on a single semiconductor substrate (and packaged in a single semiconductor package), multiple semiconductor substrates (and packaged in a single semiconductor package as a single IC) or in multiple IC packages and included as a module.

In an example, the eUSB2 device 202 is a SoC operating as a host or a controller device, and the eUSB2 device 204 is a connected device, which may be another SoC, a data storage or memory device, an eUSB2 repeater, etc. Other examples of eUSB2 devices 202 and 204 are anticipated within the scope of this description. The eUSB2 devices 202 and 204 include circuitry (not shown) that enable serial communication over a bus 201 using the communication protocol defined by, consistent with, and/or compliant with eUSB2. Depending on the device types, the devices 202 and 204 include circuitry (not shown) to communicate in native mode and/or in repeater mode.

The bus 201 includes conductors 203, 205, 207 and 209 for transferring signaling between the eUSB2 devices 202 and 204. A conductor may include one or more electrical traces, conductors or other type of signal line. As shown, eUSB2 device 202 includes an eUSB2 data+ pin eDP0 (the eDP0 pin) coupled to the conductor 203 of the data bus 201 and an eUSB2 data-pin eDM0 (the eDM0 pin) coupled to the conductor 205 of the data bus 201. eUSB2 device 204 includes an eUSB2 data+ pin eDP1 (the eDP1 pin) coupled to the conductor 207 of the data bus 201 and an eUSB2 data− pin eDM1 (the eDM1 pin) coupled to the conductor 209 of the data bus 201.

In the example embodiment of FIG. 2, the couplings between the eDP0, eDM0, eDP1, and eDM1 pins and the bus 201 enable the eUSB2 devices 202 and 204 to communicate signaling at a first data rate called a "high-speed" data rate, a second data rate called a "fullspeed" data rate, and a third data rate called a "low-speed" data rate. The "high-speed" data rate is the fastest data rate supported by eUSB2 and is currently defined in the standards as 480 megabits per second (Mb/s). The "full-speed" data rate is a middle data rate supported by eUSB2 and is currently defined in the standards as 12 Mb/s. The "low-speed" data rate is the slowest data rate supported by eUSB2 and is currently defined in the standards as 1.5 Mb/s.

The intermediary device 206 is coupled to the bus 201 and facilitates the communication between devices 202 and 204. In this example, the intermediary device 206 (similar to intermediary device 106 in FIG. 1) includes signal conditioner circuitry 208 (similar to signal conditioner circuitry 108 in FIG. 1), state detector and controller circuitry 210 (similar to state detector and controller circuitry 110 in FIG. 1), level shifter circuitry 212 (similar to level shifter circuitry 112 in FIG. 1), L1 mode or state detector circuitry 216 (also referred to herein as L1 circuitry 216), and eSE1 mode or state detector circuitry 218 (also referred to herein as eSE1 circuitry 218). The components or elements 208-212, 216, and 218 of the intermediary device 206 may be included on a single semiconductor substrate (and packaged in a single semiconductor package), multiple semiconductor substrates (and packaged in a single semiconductor package as a single IC) or in multiple IC packages and included as a module, separate from the eUSB2 devices 202 and 204.

The state detector and controller circuitry 210 monitors the signaling, e.g., one or more signals or sequences of signals such as is included in one or more packets and/or control messages, on the bus 201. The state detector and controller circuitry 210 then detects a state of the communication on the bus 201 (i.e., the bus state or state) from the signaling. Depending on the detected state, the state detector and controller circuitry 210 controls, e.g., enables or disables, operation of the signal conditioner circuitry 208, the level shifter circuitry 212, the L1 circuitry 216, and/or the eSE1 circuitry 218. Moreover, once enabled, the L1 circuitry 216 and/or the eSE1 circuitry 218 may provide input to the state detector and controller circuitry 210 to further control operation of the signal conditioner circuitry 208 and/or the level shifter circuitry 212.

In order to monitor the signaling on the bus 201 and detect the bus state, the state detector and controller circuitry 210 includes receiver circuitry coupled to the bus 201 to receive the signaling and a digital finite state machine (FSM) 222 to detect the bus state from the received signaling. The digital FSM 222 includes: an FSM 224 implemented by digital circuitry and one or more oscillators 226 coupled to the FSM 224. The digital circuitry of the FSM 224 may include one or more or a combination of logic gates, combinational logic, flip flops, relays, registers, programmable logic devices, and/or programmable logic controllers. The FSM 224 is implemented as a simplified state machine that passively detects the bus state instead of actively participating in protocol handshakes like a packet repeater. The oscillator(s) 226 provide one or more clock signals to enable sampling of the signals at receiver outputs used by the FSM 224 to detect the bus state. Oscillator 226 may be implemented using a crystal oscillator, a Microelectromechanical system (MEMs) device, a bulk acoustic wave device or other electronics oscillator.

The receiver circuitry of the state detector and controller circuitry 210 includes single ended or single-input receivers 228, 230, 232 and 234 and dual-input receivers 236 and 238. For example, the receivers 228-234 are voltage buffers, e.g., single-ended complementary metal-oxide semiconductor (CMOS) buffers, which act as analog comparators that compare the single signal at the input to a function of a supply voltage provided to the comparator to determine the signal at the output. For example, when the signal input to the single-ended receiver exceeds half the voltage supply, the output signal is a logic level 1; otherwise, the output signal is a logic level 0. The receivers 236 and 238 are differential receivers that compare the signals at the two inputs to generate a signal at the output. For example, when the signal at the eDP0 pin exceeds the signal at the eDM0 pin, the output signal is a logic level 1; otherwise, the output is a logic level 0. Similarly, when the signal at the eDP1 pin exceeds the signal at the eDM1 pin, the output signal is a logic level 1; otherwise, the output is a logic level 0. In other examples, the differential receivers 236 and 238 are not included in the state detector and controller circuitry 210.

As illustrated, the input of the receiver 228 is coupled to the conductor 203 to receive the signaling from the eDP0 pin of the eUSB2 device 202, and the input of the receiver 230 is coupled to the conductor 205 to receive the signaling from the eDM0 pin of the eUSB2 device 202. The inputs of the receiver 236 are respectively coupled to the conductors 203 and 205 to receive the signaling from both the eDP0 and eDM0 pins. As further illustrated, the input of the receiver 232 is coupled to the conductor 207 to receive the signaling from the eDP1 pin of the eUSB2 device 204, and the input of the receiver 234 is coupled to the conductor 209 to receive the signaling from the eDM1 pin of the eUSB2 device 204. The inputs of the receiver 238 are respectively coupled to the conductors 207 and 209 to receive the signaling from both the eDP1 and eDM1 pins. Outputs of the receivers 228-238 are coupled to the FSM 224.

During operation, the FSM 224, through its digital circuitry, samples the signaling from the receivers 228-238 to determine the bus state. For example, where the eUSB2 device 202 functions as a SoC controller or host, the eUSB2 device 202 may detect the startup or connection of the eUSB2 device 204 on the bus 201. Alternatively, during communication on the bus 201, where the eUSB2 device 204 supports low-speed, full-speed, and high-speed signaling, the data rate may change from one data rate to another data rate, e.g., from lowspeed or full-speed to high-speed signaling. Responsively or accordingly, the eUSB2 device 202 and/or the eUSB2 device 204 sends signaling on the bus 201 indicating the data rate for the communication on the bus 201. In an example, the signaling includes a particular sequence of voltage levels identifiable by the FSM 224. The signaling may include control signaling, for instance control commands or messages that indicate an L0 state and the data rate for the L0 state.

In an example, the FSM 224 receives one or more voltage output signal sequences from the receivers 228 and 230, which the FSM 224 identifies as low-speed or full-speed signaling on the bus 201. In accordance with eUSB2, to differentiate low-speed from full-speed signaling, all low-speed signaling is the inverse of full-speed, e.g., eD+ and eD− are swapped, except for control message signaling. Alternatively, the FSM 224 receives one or more voltage output signal sequences from the receivers 228 and 230 and/or one or more voltage output signal sequences from the differential receiver 236, which the FSM 224 identifies as high-speed signaling on the bus 201.

In one example, upon detecting the eUSB2 high-speed data rate, the FSM 224 sends one or more signals on a conductor 211 that couples the signal conditioner circuitry 208 to the state detector and controller circuitry 210. The FSM 224 also sends one or more signals on a conductor 213 that couples the level shifter circuitry 212 to the state detector and controller circuitry 210. The one or more signals (e.g., enable signals) on the conductor 211 enable operation of the signal conditioner circuitry 208. The one or more signals (e.g., disable signals) on the conductor 213 disable operation of the level shifter circuitry 212. Conversely, upon detecting the eUSB2 low-speed or full-speed data rate, or as a default when not operating the signal conditioner circuitry 208, the FSM 224 sends one or more signals on the conductors 211 and 213 to disable operation of the signal conditioner circuitry 208 and enable operation of the level shifter circuitry 212. In an example, an enable signal is a logic level 1 or “high” signal or state, and a disable signal is a logic level 0 or “low” signal or state. However, in another example, the opposite may be implemented.

Additionally, upon detecting the eUSB2 high-speed data rate, the FSM 224 sends one or more signals on a conductor 215 that couples the L1 circuitry 216 to the state detector and controller circuitry 210. The one or more signals on the conductor 215 enable operation of the L1 circuitry 216 during operation of the signal conditioner circuitry 208.

When the L1 circuitry 216 detects an eUSB2 L1 state, it signals the FSM 224 via the conductor 215 coupling the L1 circuitry 216 to the state detector and controller circuitry 210. Responsive thereto, the FSM 224 may send one or more signals on the conductors 211 and 215 to disable operation of the signal conditioner circuitry 208 and the L1 circuitry 216 until the FSM 224 detects an eUSB2 L1 resume state, for instance. Responsive to the L1 resume state, and in some examples upon detecting the eUSB2 high-speed data rate, the FSM 224 may send one or more signals on the conductors 211 and 215 to re-enable operation of the signal conditioner circuitry 208 and the L1 circuitry 216. The L1 state is part of link power management in accordance with eUSB2. An example implementation of L1 circuitry 216, and its operation, is described later with reference to FIGS. 6-8.

The eSE1 circuitry 218 detects an eUSB2 single ended one (eSE1) state or an XeSE1 state. Example eSE1 states include extended single ended one (ESE1), SOWake, SOResume, and SOReset, to name a few. In a particular example, the ESE1 state announces a device disconnect event or a port reset event during power-up of the eUSB2 device 202 and/or 204. The eSE1 circuitry 218 detecting port reset during power-up precedes and, in this example enables, the FSM 224 detecting the data rate used on the bus 201. The ESE1 state is detected when the signaling on both conductors 203 and 205 are at a logic level 1 or a high state or the signaling on both the conductors 207 and 209 are at a high state for a period of time defined by the eUSB2 standards.

During operation and responsive to the FSM 224 detecting the high state from the output signals of the receivers 228 and 230 or the receivers 232 and 234, the FSM 224 sends one or more signals on a conductor 217 that couples the eSE1 circuitry 218 to the state detector and controller circuitry 210. The one or more signals on the conductor 217 reset operation of the eSE1 circuitry 218. When the eSE1 circuitry 218 detects the ESE1 state, it signals the FSM 224 via the conductor 217 coupling the eSE1 circuitry 218 to the state detector and controller circuitry 210. The FSM 224 can then proceed to detect the data rate on the bus 201.

In an example, the eSE1 circuitry 218 includes four single-ended receivers (not shown), e.g., CMOS buffers, and a counter function (not shown), e.g., an oscillator to generate a clock signal and a digital counter, coupled to the receivers. Two of the receivers are respectively coupled to the conductors 203 and 205 to detect the signaling from the eUSB2 device 202. The other two receivers are respectively coupled to the conductors 207 and 209 to detect the signaling from the eUSB2 device 204. The eSE1 circuitry 218 may also include switches coupling the receivers to the bus 201.

Upon receiving the one or more signals on the conductor 217, two of the switches close to couple two of the receivers to the bus 201. The closed switches respectively couple the receivers to the conductors 203 and 205 or respectively couple the receivers to the conductors 207 and 209. When the counter indicates a high state of the signals has been maintained at the receiver outputs for the requisite amount of time to indicate the ESE1 state, the eSE1 circuitry 218 signals the FSM 224 via the conductor 217. After receiving the signaling indicating the ESE1 state, the FSM 224 may responsively send one or more signals on the conductor 217 to open the switches and reset the counter of the eSE1 circuitry.

The level shifter circuitry 212 is implemented as a bit-level repeater that translates signals on the bus 201 from one logic level or voltage domain to another between the eUSB2 devices 202 and 204. In the illustrated example, the voltage domain within which the eUSB2 devices 202 and 204 operate or that is compatible with the eUSB2 devices 202 and 204 is one of 0.8V, 1.0V, or 1.2V, which determines a high logic level, e.g., 1, in a binary configuration. The low logic level, e.g., 0, is determined by ground references for the level shifter circuitry 212.

The level shifter circuitry 212 includes receivers 240, 242, 244, 246 and translation circuitry 248, 250, 252, 254, which enable two-way voltage level translation between the eUSB2 devices 202 and 204. In an example, the receivers 240-246 are single-ended CMOS buffers, and the translation circuitry 248-254 includes switches.

As shown, an input of the receiver 240 is coupled to the conductor 203, and an input of the receiver 242 is coupled to the conductor 205 to receive signaling at a voltage level supported by the eUSB2 device 202. An output of the receiver 240 is coupled to an input of the translation circuitry 248, and an output of the receiver 242 is coupled to an input of the translation circuitry 250. Further, an output of the translation circuitry 248 is coupled to the conductor 207, and an output of the translation circuitry 250 is coupled to the conductor 209 to enable translation of the signaling from the receivers 240 and 242 to voltage and ground reference levels supported by the eUSB2 device 204.

In the reverse direction, an input of the receiver 244 is coupled to the conductor 207, and an input of the receiver 246 is coupled to the conductor 209 to receive signaling at a voltage level supported by the eUSB2 device 204. An output of the receiver 244 is coupled to an input of the translation circuitry 252, and an output of the receiver 246 is coupled to an input of the translation circuitry 254. Further, an output of the translation circuitry 252 is coupled to the conductor 203, and an output of the translation circuitry 254 is coupled to the conductor 205 to enable translation of the signaling from the receivers 244 and 246 to voltage and ground reference levels supported by the eUSB2 device 202.

In an implementation, only one direction of the level shifter circuitry 212 is active at a time, e.g., for communication from the eUSB2 device 202 to the eUSB2 device 204 or communication from the eUSB2 device 204 to the eUSB2 device 202. For example, the signal(s) on the conductor 213 that enable operation of the level shifter circuitry 212 also set the direction in which it performs the voltage translation. An example implementation of the level shifter circuitry 212 is described later by reference to FIG. 3.

The signal conditioner circuitry 208 includes a switch SW1, a switch SW2, and highspeed (HS) signal booster circuitry 220 (also referred to herein as signal booster circuitry 220). The switches SW1 and SW2 can include one or more transistors of a suitable type such as field-effect transistors (FETs) and/or bipolar junction transistors (BJTs). A first terminal or end of switch SW1 is coupled to the conductor 203, and a second terminal of the switch SW1 is coupled to the conductor 207 and to the signal booster circuitry 220. A first terminal of switch SW2 is coupled to the conductor 205, and a second terminal of the switch SW2 is coupled to the conductor 209.

Responsive to one or more signals on the conductor 211, the switches SW1 and SW2 transition from an open state (open) to a closed state (closed) to couple the signal booster circuitry 220 to the bus 201. Once coupled, the signal booster circuitry 220 boosts the power of the signaling on the bus 201. An example implementation of the signal conditioner circuitry 208 is described later by reference to FIGS. 4 and 5.

Figure 3:
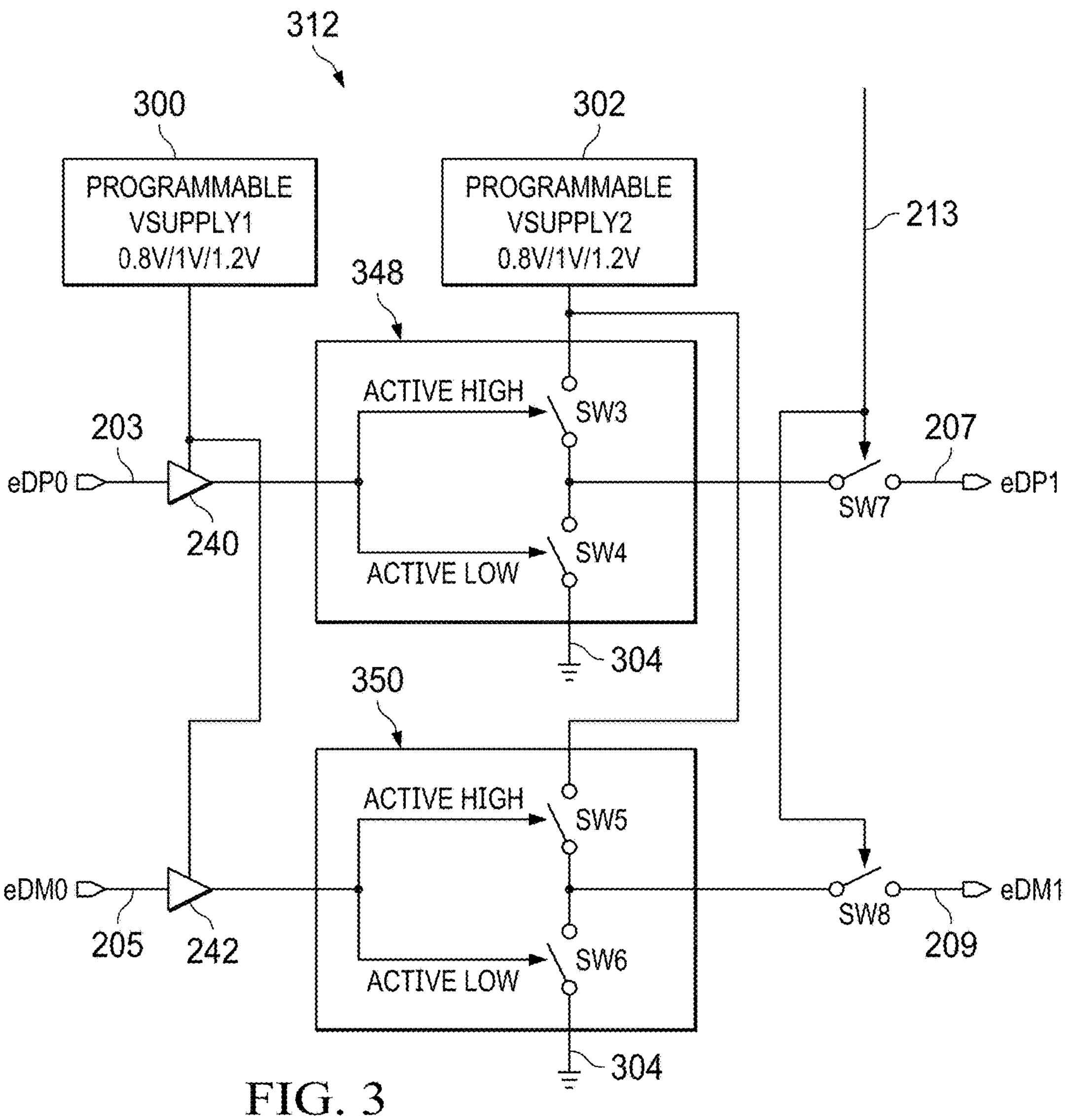
FIG. 3 is a schematic diagram depicting example level shifter circuitry.

FIG. 3 depicts level shifter circuitry 312 in accordance with the described examples. Level shifter circuitry 312 is an example partial implementation of the level shifter circuitry 112 of FIG. 1 and the level shifter circuitry 212 of FIG. 2. Particularly, the components illustrated in FIG. 3 enable voltage translation of low-speed and full-speed signaling from the eUSB2 device 202 to the eUSB2 device 204. The same or similar circuitry may be used to enable voltage translation of low-speed and full-speed signaling from the eUSB2 device 204 to the eUSB2 device 202.

The level shifter circuitry 312 includes the receivers 240 and 242 respectively coupled to the eDP0 and eDM0 pins via the conductors 203 and 205, programmable voltage supplies 300 and 302, translation circuitry 348 which includes switches SW3 and SW4, translation circuitry 350 which includes switches SW5 and SW6, and switches SW7 and SW8. The switches SW3 and SW4 operate alternatively, meaning that when one switch is open the other switch is closed, and vice versa. Similarly, the switches SW5 and SW6 operate alternatively. Moreover, the switches SW3-SW8 can include one or more transistors of a suitable type such as FETs and/or BJTs. Also, the programmable voltage supplies 300 and 302 can each be programmed to 0.8V, 1.0V, or 1.2V. However, other voltage levels are anticipated within the scope of this description.

The programmable voltage supply 300 is coupled to respective inputs of the receivers 240 and 242 and is programmed to a voltage level $V_{SUPPLY1}$ supported by the eUSB2 device 202. The programmable voltage supply 302 is coupled to respective first terminals of the switches SW3 and SW5 and is programmed to a voltage level $V_{SUPPLY2}$ supported by the eUSB2 device 204. A second terminal of the switch SW3 is coupled to the output of the receiver 240 and a first terminal of the switch SW4. A third terminal of the switch SW3 is coupled to a second terminal of the switch SW4 and a first terminal of the switch SW7. A third terminal of the switch SW4 is coupled to a ground reference 304 (also referred to herein as ground 304) of the eUSB2 device 204. The conductor 213 is coupled to respective second terminals of switches SW7 and SW8, and a third terminal of the switch SW7 is coupled to the conductor 207.

A second terminal of the switch SW5 is coupled to the output of the receiver 242 and a first terminal of the switch SW6. A third terminal of the switch SW5 is coupled to a second terminal of the switch SW6 and a first terminal of the switch SW8. A third terminal of the switch SW6 is coupled to ground 304, and a third terminal of the switch SW8 is coupled to the conductor 209.

Responsive to an enable signal, e.g., a logic 1, on the conductor 213, the switches SW7 and SW8 transition from the open state to the closed state to respectively couple the translation circuitry 348 and 350 to the conductors 207 and 209. In an example, when the signaling at the input of the receiver 240 exceeds $V_{SUPPLY1}/2$, the output of the receiver 240 is at logic level 1, which represents a logic level 1 for the eUSB2 device 202. The logic level 1 at the output of the receiver 240 closes the switch SW3 to provide $V_{SUPPLY2}$ on the conductor 207, which represents a logic level 1 for the eUSB2 device 204. The logic level 1 at the output of the receiver 240 causes an open state of the switch SW4.

Conversely, when the signaling at the input of the receiver 240 is less than $V_{SUPPLY1}/2$, the output of the receiver 240 is at logic level 0, which represents a logic level 0 for the eUSB2 device 202. The logic level 0 at the output of the receiver 240 closes the switch SW4 to provide the ground reference 304 on the conductor 207, which represents a logic level 0 for the eUSB2 device 204. The logic level 0 at the output of the receiver 240 causes an open state of the switch SW3.

Similarly, when the signaling at the input of the receiver 242 exceeds $V_{SUPPLY1}/2$, the output of the receiver 242 is at logic level 1, which represents a logic level 1 for the eUSB2 device 202. The logic level 1 at the output of the receiver 242 closes the switch SW5 to provide $V_{SUPPLY2}$ on the conductor 209, which represents a logic level 1 for the eUSB2 device 204. The logic level 1 at the output of the receiver 242 causes an open state of the switch SW6.

Conversely, when the signaling at the input of the receiver 242 is less than $V_{SUPPLY2}$, the output of the receiver 242 is at logic level 0, which represents a logic level 0 for the eUSB2 device 202. The logic level 0 at the output of the receiver 242 closes the switch SW6 to provide the ground reference 304 on the conductor 209, which represents a logic level 0 for the eUSB2 device 204. The logic level 0 at the output of the receiver 242 causes an open state of the switch SW5. Furthermore, responsive to receiving a disable signal, e.g., a logic 0, on the conductor 213, the switches SW7 and SW8 transition from the closed state to the open state to respectively decouple the translation circuitry 348 and 350 from the conductors 207 and 209.

Figure 4:
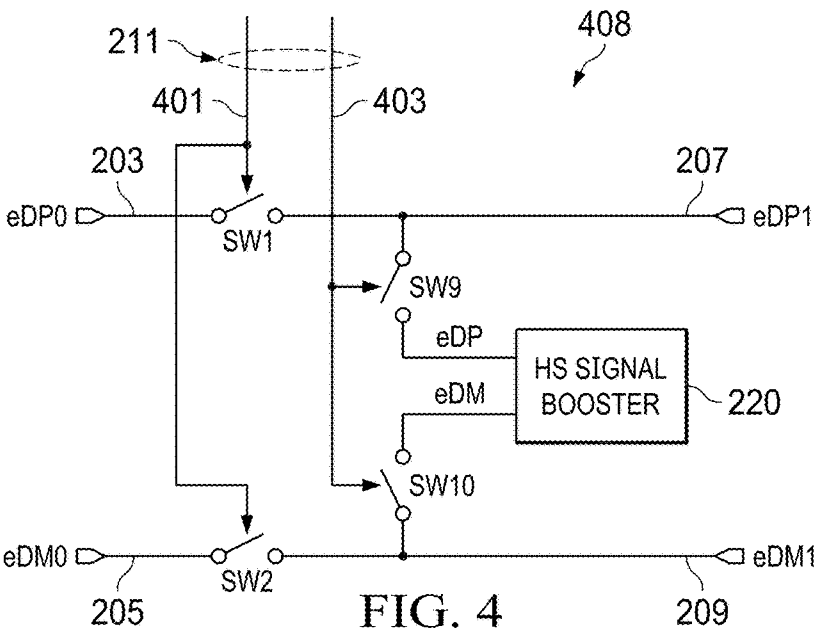
FIG. 4 is a schematic diagram depicting example signal conditioner circuitry.

FIG. 4 depicts signal conditioner circuitry 408 in accordance with the described examples. Signal conditioner circuitry 408 is an example implementation of the signal conditioner circuitry 108 of FIG. 1 and the signal conditioner circuitry 208 of FIG. 2. The signal conditioner circuitry 408 includes the switches SW1 and SW2, switches SW9 and SW10, and the signal booster circuitry 220.

A signal line 401 of the conductor 211 is coupled to respective first terminals of the switches SW1 and SW2, and a signal line 403 of the conductor 211 is coupled to respective first terminals of the switches SW9 and SW10. A second terminal of the switch SW1 is coupled to the conductor 203, and a third terminal of the switch SW1 is coupled to the conductor 207 and to a second terminal of the switch SW9. A third terminal of the switch SW9 is coupled to the signal booster circuitry 220. A second terminal of the switch SW2 is coupled to the conductor 205, and a third terminal of the switch SW2 is coupled to the conductor 209 and to a second terminal of the switch SW10. A third terminal of the switch SW10 is coupled to the signal booster circuitry 220.

Figure 5:
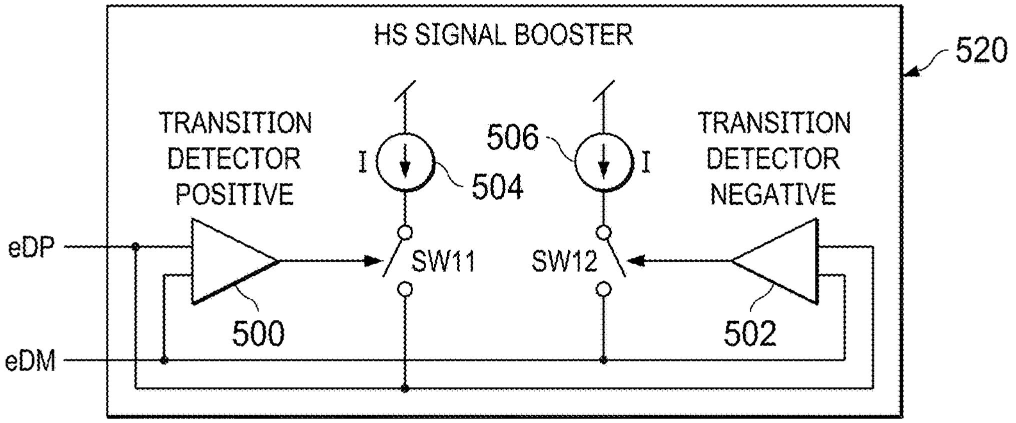
FIG. 5 is a schematic diagram depicting some details of the high-speed signal booster illustrated in FIG. 4.

Responsive to an enable signal, e.g., a logic 1, on signal lines 401 and 403 of the conductor 211, the switches SW1, SW2, SW9, and SW10 transition from the open state to the closed state. The closed switches SW1 and SW9 couple the conductors 203 and 207 to the signal booster circuitry 220, and the closed switches SW2 and SW1 couple the conductors 205 and 209 to the signal booster circuitry 220. This enables operation of the signal booster circuitry 220, FIG. 5 depicts a schematic diagram of signal booster circuitry 520 in accordance with the described examples. The signal booster circuitry 520 is an example implementation of the signal booster circuitry 220 of FIGS. 2 and 4. The signal booster circuitry 520 includes transition detector circuits 500 and 502, current sources 504 and 506, and switches SW11 and SW12. In an example, the transition detection circuit 500 is a differential comparator having first and second inputs coupled to the bus 201 to receive data+ and data−≥differential signals (e.g., from the eDP0 and eDM0 pins or from the eDP1 and eDM1 pins) and, therefrom, detect a rising edge of the differential signals. Similarly, the transition detection circuit 502 is a differential comparator having first and second inputs coupled to the bus 201 to receive data+ and data− differential signals and, therefrom, detect a falling edge of the differential signals.

An output of transition detector circuit 500 is coupled to a first terminal of the switch SW11. A second terminal of the switch SW11 is coupled to an output of the current source 504, and a third terminal of the switch SW11 is coupled to the bus 201 to receive signaling from the eDP0 and eDP1 pins during operation of the signal booster circuitry 220. Similarly, an output of transition detector circuit 502 is coupled to a first terminal of the switch SW12. A second terminal of the switch SW12 is coupled to an output of the current source 506, and a third terminal of the switch SW12 is coupled to the bus 201 to receive signaling from the eDM0 and eDM1 pins during operation of the signal booster circuitry 220.

On detecting a rising edge of the differential signal on the bus 201, the transition detector circuit 500 outputs a signal that closes the switch SW11. Responsively, the current source 504 sources current to the conductor 203 or 207 (depending on the direction of the highspeed signaling) to boost the rising edge on the conductor. When a rising edge is not detected, the transition detector circuit 500 outputs a signal that opens the switch SW11 to disconnect the current source 504 from the bus 201.

On detecting a falling edge of the differential signal on the bus 201, the transition detector circuit 502 outputs a signal that closes the switch SW12. Responsively, the current source 506 sinks current from the conductor 205 or 209 (depending on the direction of the highspeed signaling) to boost the failing edge on the conductor. When a falling edge is not detected, the transition detector circuit 502 outputs a signal that opens the switch SW12 to disconnect the current source 506 from the bus 201.

In another example, the current sources 504 and 506 are adjustable current sources. For instance, the state detector and controller circuitry 210 (or 110) may include circuitry (not shown) that senses the impedance on the bus 201 to determine the boost current provided via the current sources 504 and 506. Moreover, in some examples, the signal booster circuitry 520 is triggered only when high-speed packets are sent on the bus 202. Otherwise, the signal booster circuitry is idle.

The injected current improves the rise and fall times of the signals traveling in either direction over the bus 201 to allow for an increase in the transmission distance of the signals. Packet repeaters add jitter and skew, may truncate start of packet bits, and may add dribble bits at the end of a packet. However, the signal booster circuitry 520 may be implemented without one or more of these limitations.

Figure 6:
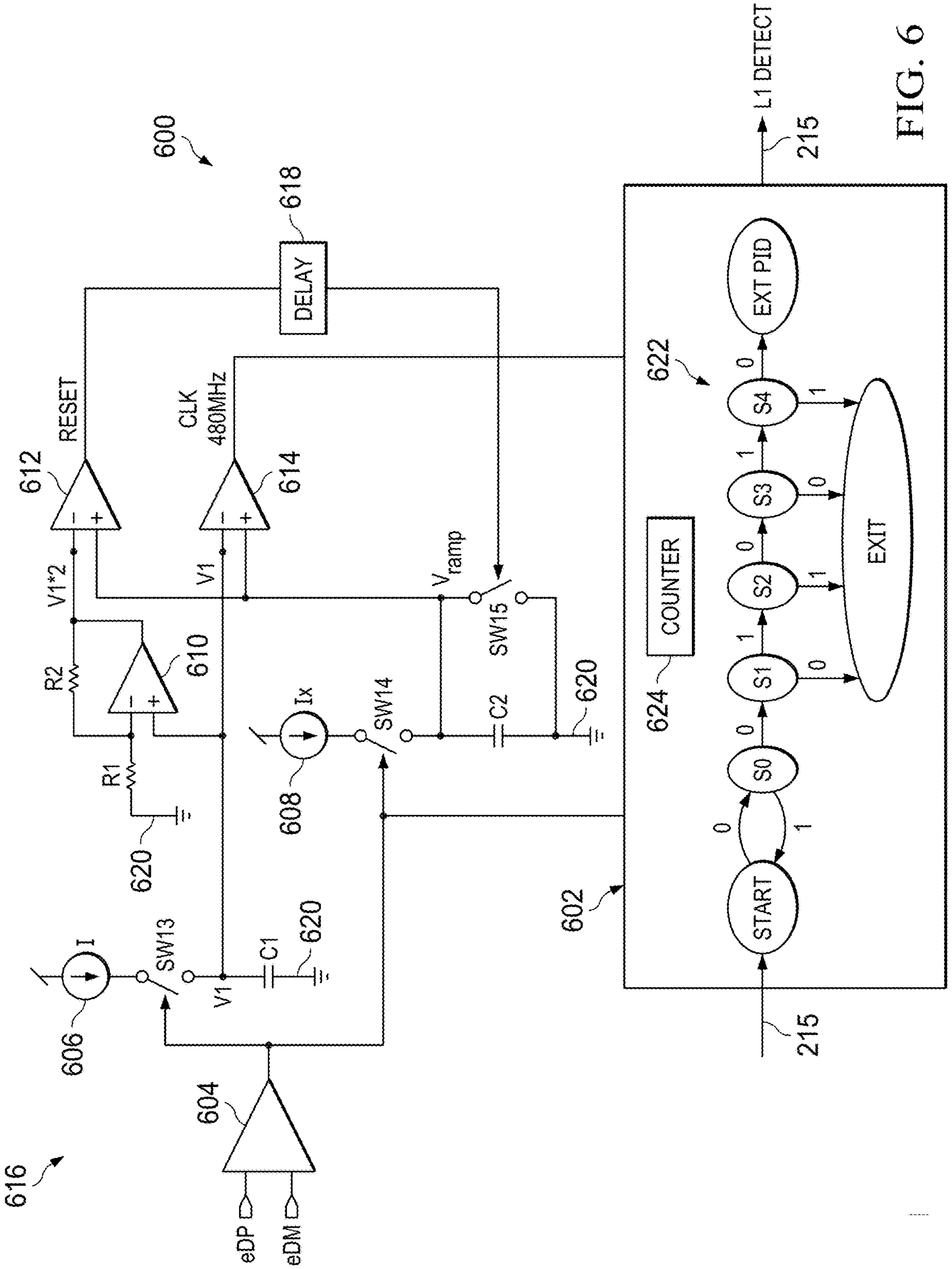
FIG. 6 is a schematic and state diagram depicting example low power mode detector circuitry.

FIG. 6 depicts L1 circuitry 616 in accordance with the described examples. L1 circuitry 616 is an example implementation of L1 circuitry 216 of FIG. 2. L1 circuitry 616 includes a clock and data recovery (CDR) circuit 600 and an FSM 602. The CDR circuit 600 derives a clock, e.g., a 480 megahertz (MHz) clock, from one or more packets on the bus 201, which it provides to the FSM 602 to use in detecting the L1 state.

The CDR circuit 600 includes a receiver 604, current sources 606 and 608, a differential amplifier 610, comparators 612 and 614, a delay circuit 618, switches SW13-SW15, capacitors C1 and C2, and resistors R1 and R2. In an example, the delay circuit 618 is a delay line, capacitors C1 and C2 have the same capacitance value, resistors R1 and R2 have the same resistance value, and the receiver 604 is a differential receiver that compares the signals at its two inputs to generate a signal at its output. For example, when the signal at the eDP0 pin exceeds the signal at the eDM0 pin, the output signal is a logic level 1; otherwise, the output signal is a logic level 0. Similarly, when the signal at the eDP1 pin exceeds the signal at the eDM1 pin, the output signal is a logic level 1; otherwise, the output signal is a logic level 0. Moreover, the switches SW13-SW15 may be FETs, BJTs, or a combination thereof.

The FSM 602 includes digital logic 622 and a counter 624. The logic 622 is used to detect a packet identifier (PID) used to indicate the L1 state. Additional logic (not shown) for performing other functions, such as detecting one or more additional PIDs, may be included in the FSM 602. The counter 624 is coupled to the output of the receiver 604 and assists in detecting the PID from the one or more packets on the data bus 201. The FSM 602 may include one or more or a combination of logic gates, combinational logic, flip flops, relays, registers, programmable logic devices, and/or programmable logic controllers. The FSM 602 also passively detects information from the communication on the bus 201 but does not actively participate in the communication protocol exchange.

As illustrated, an output of the receiver 604 is coupled to respective first terminals of switches SW13 and SW14 and to an input of the FSM 602. A second terminal of the switch SW13 is coupled to an output of the current source 606, and a third terminal of the switch SW13 is coupled to a first terminal of capacitor C1, a non-inverting input of the differential amplifier 610, and a non-inverting input of the comparator 614. A second terminal of the capacitor C1 is coupled to a ground reference 620 (also referred to herein as ground 620).

The resistors R1 and R2 and the differential amplifier 610 are coupled together to form a voltage multiplier, in this case a voltage doubler. Namely, the inverting input of the differential amplifier 610 is coupled to respective first terminals of resistors R1 and R2. A second terminal of the resistor R1 is coupled to ground 620 and a second terminal of the resistor R2 is coupled to an output of the differential amplifier 610.

An inverting input of the comparator 612 is also coupled to the output of the differential amplifier 610. A non-inverting input of the comparator 612 is coupled to: a non-inverting input of the comparator 614; respective first terminals of the switch SW15 and the capacitor C2; and an output of the current supply 608 through switch SW14. Respective second terminals of the capacitor C2 and the switch SW15 are coupled to ground 620. An output of the comparator 612 is coupled to an input of the delay circuit 618, and an output of the delay circuit 618 is coupled to a third terminal of the switch SW15. Finally, an output of the comparator 614 is coupled to another input of the FSM 602 and assists in detecting the PID from the one or more packets on the data bus 201.

The operation of the CDR circuit 600 will be described by reference to the example signaling diagram 700 illustrated in FIG. 7. The signaling diagram 700 shows differential signals 702 and 704 provided at the inputs of the receiver 604. In one example, the signal 702 is the signal provided from the eDP0 pin onto the conductor 203, and the signal 704 is the signal provided from the eDM0 pin onto the conductor 205. Alternatively, the signal 702 is the signal provided from the eDP1 pin onto the conductor 207, and the signal 704 is the signal provided from the eDM1 pin onto the conductor 209. For simplicity, the operation of the L1 circuitry 616 is described by reference to the eUSB2 device 202 sending high-speed signaling to the eUSB2 device 204, wherein the signaling contains eUSB2 packets. Thus, the signal 702 is referred to as the eDP0 signal 702, and the signal 704 is referred to as the eDM0 signal 704.

An end of packet (EOP) for a first packet is indicated at 706. The EOP is followed by a SEO (single ended zero) state indicated at 708. The SEO state is indicated by both the eDP0 signal 702 and the eDM0 signal 704, in this example, being at a logic level 0 or a low state. The SEQ state immediately precedes the start of a next packet, wherein the start of a SYNC pattern 710 indicates the start of the next packet. The CDR circuit 600 uses the SYNC pattern 710 to generate the 480 MHz clock.

During the SEO state, the L1 circuitry 616 gets reset. For example, the FSM 224 detects the SEO state and sends an enable/reset signal to the L1 circuitry 616 on the conductor

215. Responsive to the enable/reset signal, the FSM 602 resets the logic 622 to a start state, and resets the counter 624, which resets the clock for the FSM 602. Also, in an example implementation, the current sources 606 and 608 are in an off state (OFF) at the start of the SYNC pattern. In a further example, the FSM 224 enables/resets the L1 circuitry 616 only when it first enables the signal conditioner circuitry 210 so the circuitries 210 and 616 can operate concurrently. Subsequent SEO states are detected by logic (not shown) included in the FSM 602, the detection of which leads to the resetting of the L1 circuitry 616.

The start of the first SYNC bit of the SYNC pattern 710 is indicated at 712. Thereafter, each time the eDP0 signal 702 transitions to be greater than the eDM0 signal 704 (whereby the output of the receiver 604 transitions to a logic 1), the counter 624 increases to count the number of SYNC bits. The switches SW13 and SW14 are closed responsive to a logic 1 at the output of the receiver 604. However, whether the current sources 606 and 608 are in an on state (ON), to charge the respective capacitors C1 and C2 coupled thereto, depends on the counter value.

Namely, at 716 the current source 606 is turned ON after and/or responsive to the counter 624 counting the first SYNC bit. This enables the current source 606 to charge the capacitor C1 when the switch SW13 is closed. The current source 606 is turned OFF at 718, after and/or responsive to the counter 624 counting the third SYNC bit. By this time, the capacitor C1 has charged for an amount of time sufficient to produce a voltage V1 across the capacitor C1.

The voltage V1 is provided as a reference voltage at the inverting input of the comparator 614. The voltage V1 is also provided to the non-inverting input of the differential amplifier 610, which generates a voltage of 2*V1 at the output of the differential amplifier 610. The voltage 2*V1 is provided as a reference voltage at the inverting input of the comparator 612. The accuracy of the reference voltages V1 and 2*V1 is limited by leakage on the capacitor C1.

At 720, the current source 608 is turned ON after and/or responsive to the counter 624 counting the seventh SYNC bit. The current ratio of Ix to I (Ix/I) between the current sources 608 and 606 is used to tune the clock frequency to compensate for the delay between turning OFF the current source 606 and turning on the current source 608. Turning on the current source 608 enables charging the capacitor C2 when the switch SW14 is closed and further enables the operation of the comparators 612 and 614 and the switch SW15 to generate the 480 MHz clock signal (CLK) at the output of the comparator 614. In general, timing information from the signals 702 and 704 is saved in the form of a voltage $V_{RAMP}$ across the capacitor C2.

More particularly, as the capacitor C2 charges, the ramp voltage $V_{RAMP}$ rises and is provided to the respective non-inverting inputs of the comparators 612 and 614. While $V_{RAMP}$<V1, CLK is low, and a reset signal (RESET) out from the comparator 612 is low. The low RESET causes the switch SW15 to remain open. When $V_{RAMP}$ exceeds V1, CLK goes high. When $V_{RAMP}$ exceeds 2*V1, RESET goes high.

The high RESET, after a delay generated by the delay circuitry 618, closes the switch SW15. Responsively, the capacitor C2 begins to discharge and pull down $V_{RAMP}$. When $V_{RAMP}$ falls below 2*V1, RESET goes low. However, the low RESET is delayed a sufficient time for $V_{RAMP}$ to fall below V1 and pull CLK low. Once the low RESET is provided to the switch SW15, SW15 transitions to an open state to allow the capacitor C2 to begin recharging to generate the next CLK pulse.

Figure 7:
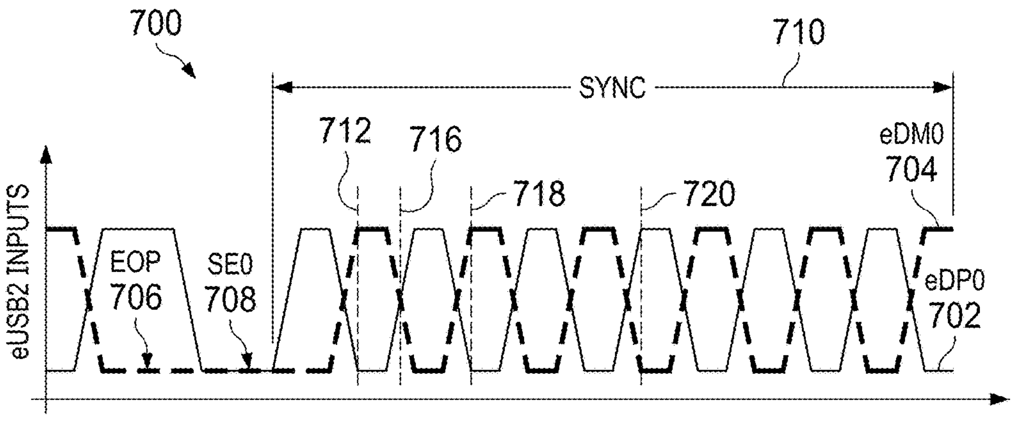
FIG. 7 is a signaling diagram depicting differential signals detectable by the circuitry in FIG. 6 to generate a clock signal for low power mode detection.

Although not shown in FIG. 7, the PID for the current packet begins after the SYNC pattern 710 ends. The FSM 602 receives both the output signal from the receiver 604 and CLK. CLK is used to sample the output signal from the receiver 604 to enable the logic 622 to detect a PID that indicates entry into the low power state. For example, entry into the L1 state is indicated by an EXT PID 1010. When the logic 622 fails to detect EXT PID, it exits. Responsively, the L1 circuitry 616 is reset and waits for the next packet. However, if the logic 622 detects EXT PID, the L1 circuitry 616 resets and attempts to detect the SUB PID and ACK PID using additional logic (not shown) of the FSM 602. If the FSM 602 fails to detect SUB PID or ACK PID, the L1 circuitry 616 is reset and waits for the next packet. Upon detecting EXT PID, SUB PID, and ACK PID, the FSM 602 signals the FSM 224, e.g., using a logic 1, on the conductor 215 to indicate valid entry in the L1 state.

Figure 8:
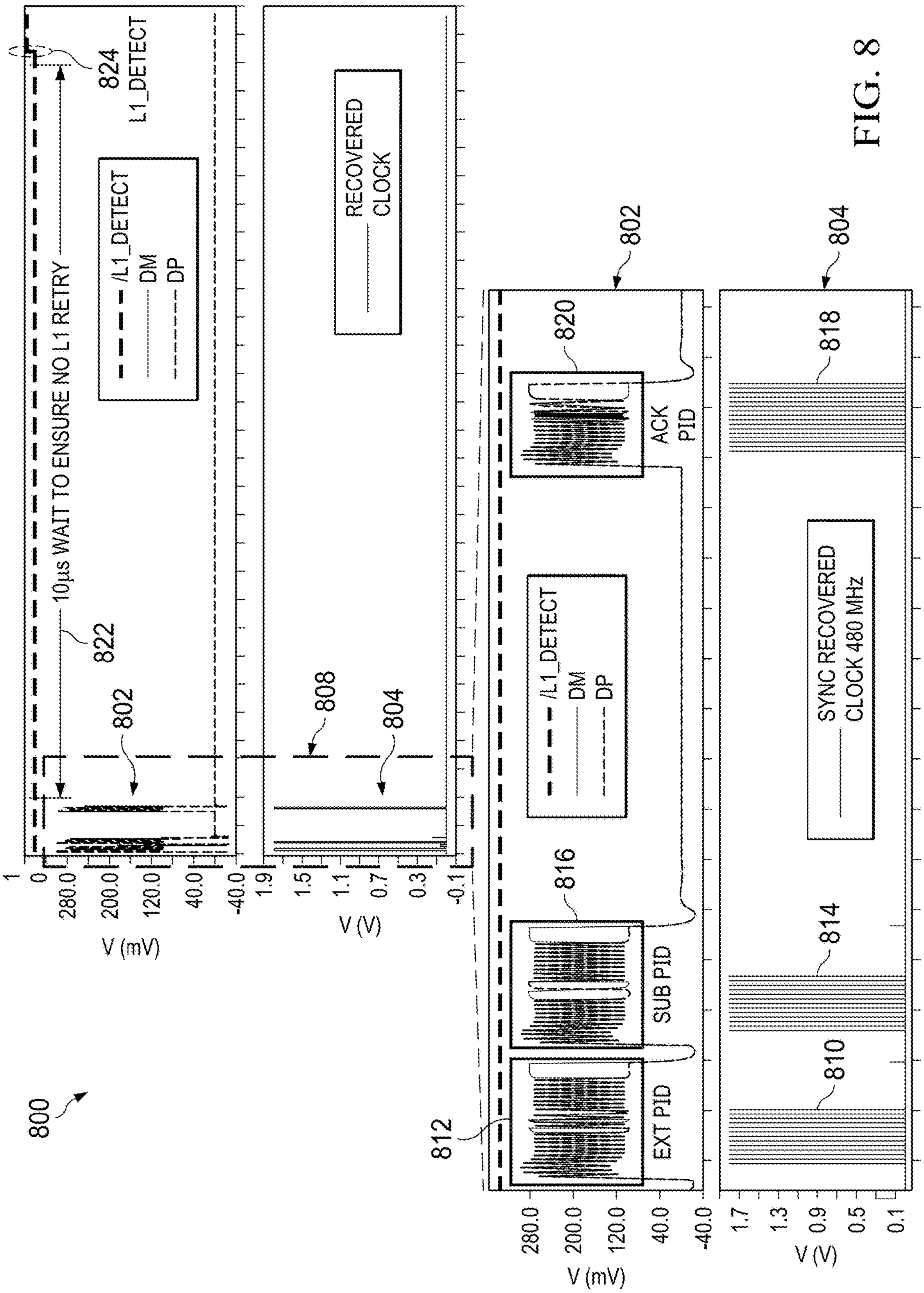
FIG. 8 is a signaling diagram depicting simulation results illustrating low power mode detection by the circuitry in FIG. 6.

FIG. 8 illustrates a signaling diagram 800 depicting simulation results from the L1 circuitry 616 detecting the L1 state. The signaling diagram 800 illustrates eDP and eDM signals 802 carrying multiple packets, CLK signals 804 generated from packets communicated by the eDP and eDM signals 802, and a signal 806 on the conductor 215. An exploded segment 808 of the eDP and eDM signals 802 and the CLK signals 804 shows a generated CLK signal 810 used to detect the EXT PID 812 of a first packet, a generated CLK signal 814 used to detect the SUB PID 816 of a second packet, and a generated CLK signal 818 used to detect the ACK PID 820 of a third packet. After the ACK PID is detected, the FSM 602 sends a logic 1 (indicated at 824) on the conductor 215 to the FSM 624 to entry into the L1 state. In this example, as indicated at 822, the FSM 602 waits 10 microseconds after the ACK PID is detected to signal L1 detect. However, in other examples the waiting period is different, or there is no waiting period.

Figure 9:
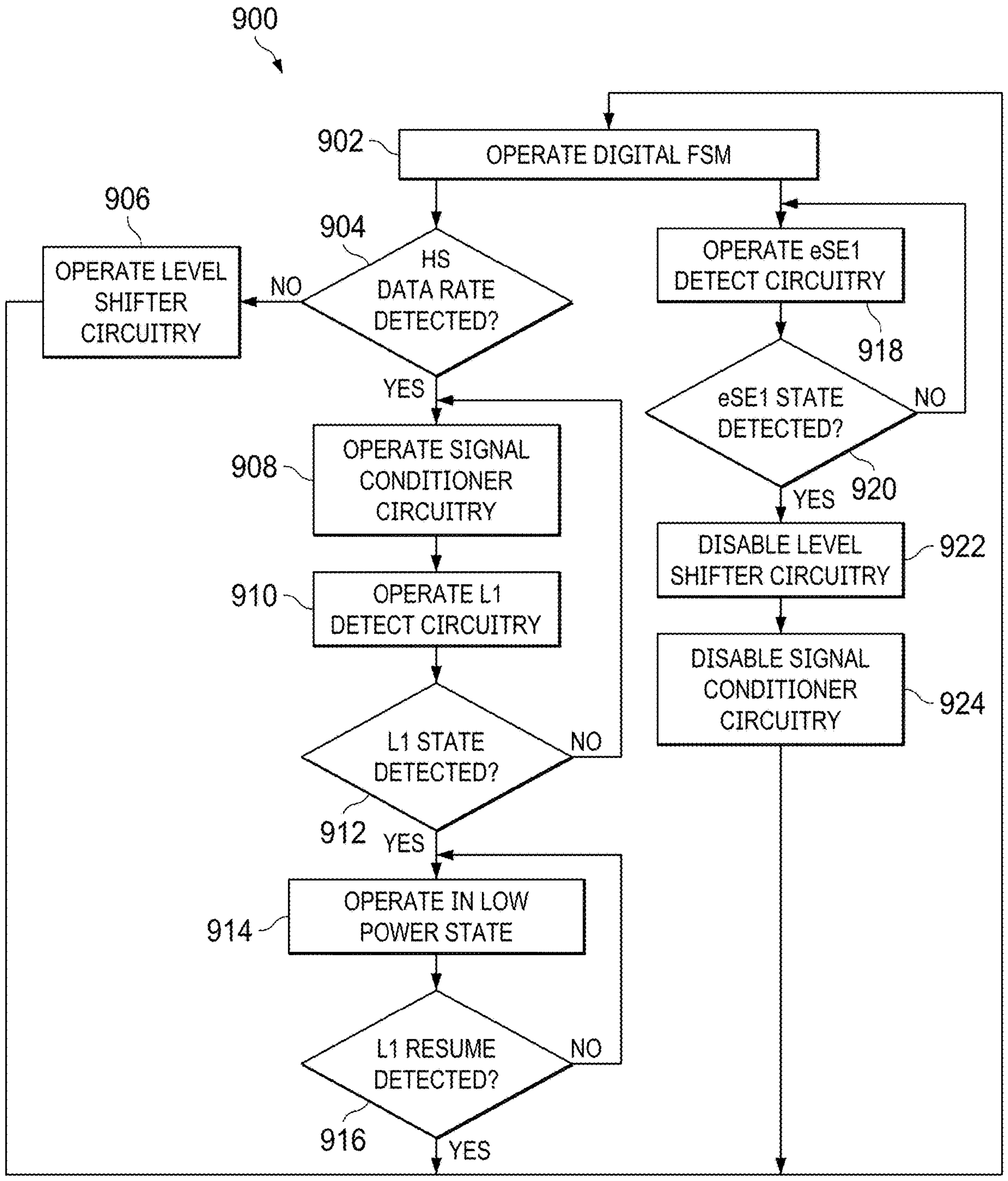
FIG. 9 is a flowchart of an example method for operating an intermediary device that includes a signal conditioner, a level shifter, and state detector and controller circuitry.

FIG. 9 is a flowchart of an example method 900 for operating an intermediary device that includes signal conditioner circuitry, level shifter circuitry, and state detector and controller circuitry. In one example, the method 900 is performed by the intermediary device 106 described by reference to FIG. 1. In another example, the method 900 is performed by the intermediary device 206 described by reference to FIG. 2. Moreover, in yet another example, method 900 implements only a portion or some of the functionality or operability of an intermediary device according to the described examples, and method 900 illustrates one example method of operation. For simplicity, method 900 is described by reference to the example intermediary device 206, as described above by reference to FIGS. 2-8.

In accordance with the method 900, the state detector and controller circuitry 210 receives signals from the bus 201 using one or more of the receivers 228-238 and operates the digital FSM 222, at block 902, to detect a bus state or state of communications from the signals. Detecting the bus state includes detecting, from the signals received at the receiver circuitry, a first data rate or a second data rate, at block 904. In this example, the FSM 224 determines, at block 904, whether the high-speed (HS) data rate is detected. If the FSM 224 does not detect the high-speed data rate but instead detects the low-speed or full-speed data rate, the FSM 224 enables operation of the level shifter circuitry 212, at block 906. The level shifter circuitry 212 is for shifting a voltage level of the signals from a first voltage level to a second voltage level. In an example, the level shifter circuitry is implemented and operated according to the example level shifter circuitry 312. While operating the level shifter circuitry 212, the method 900 also continues with the operation of the digital FSM 222, at block 902, to enable detection of other bus states as needed, including detection of the data rate.

If the FSM 224 detects the high-speed data rate, the FSM 224 enables operation of the signal conditioner circuitry 208, at block 908, and the L1 circuitry 216, at block 910. In an example, the signal conditioner circuitry is implemented and operated according to the example signal conditioner circuitry 408 and HS signal booster 520, and the L1 circuitry is implemented and operated according to the example L1 circuitry 616. For example, operating the signal conditioner circuitry 208 is for boosting edges of the signals. Also, in an example, operating the L1 circuitry 216 is for detecting a L1 state, at block 912. For instance, operating the L1 circuitry 216 includes generating clock signals, e.g., by the CDR circuit 600 using a respective synchronization (SYNC) pattern within packets communicated in the signals. Moreover, detecting the L1 state includes providing the clock signals to a finite state machine, e.g., FSM 622, and detecting indications of an EXT PID, a SUB PID, and an ACK PID in a succession of the packets, by the finite state machine, using the clock signals.

At block 912, if the L1 state is not detected, the method 900 continues with operating the signal conditioner circuitry 208, at block 908, and the L1 circuitry 216, at block 910. If the L1 state is detected, the intermediary device 206 operates in a low power state, at block 914. The low power state includes at a minimum disabling the signal conditioner circuitry 208. The low power state continues until an L1 resume state is detected, at block 916. When the L1 resume state is detected, the method 900 continues with the operation of the digital FSM 222, at block 902, to enable detection of other bus states as needed, including detection of the data rate.

While operating the signal conditioner circuitry 208 or the level shifter circuitry 212, the digital FSM 222 also enables operation of the eSE1 circuitry 218, at block 918. Operating the eSE1 circuitry 218 is for detecting one or more eSE1 states from the signals, at block 920. In an example, the eSE1 circuitry 218 can continue to operate until an eSE1 state is detected, at block 920. Once detected, the digital FSM 222 can disable one or both of the level shifter circuitry 212 or the signal conditioner circuitry 208, at blocks 922 and 924. The method 900 can continue with the operation of the digital FSM 222, at block 902, to enable detection of other bus states as needed, including detection of the data rate.

Figure 10:
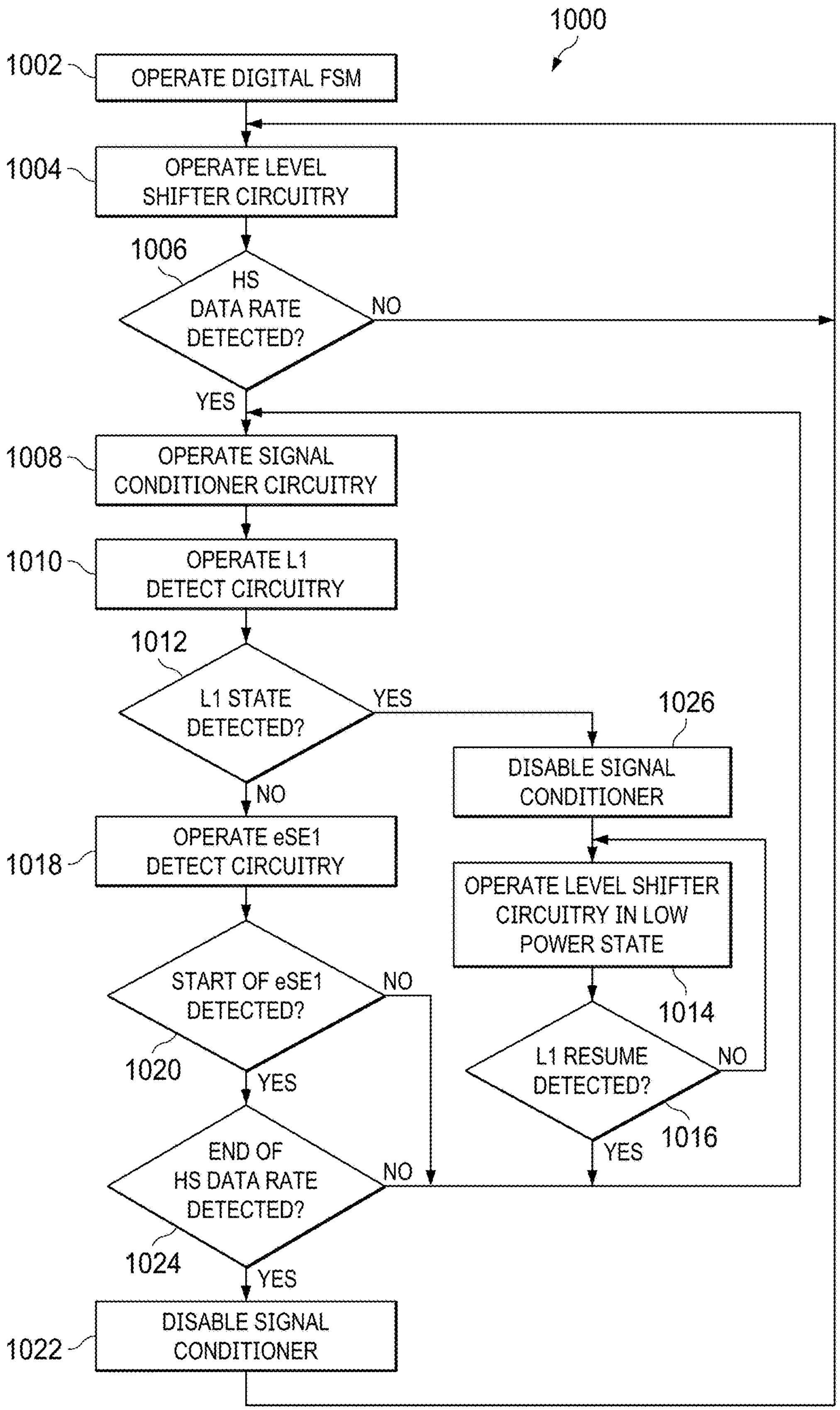
FIG. 10 is a flowchart of another example method for operating an intermediary device that includes a signal conditioner, a level shifter, and state detector and controller circuitry.

FIG. 10 is a flowchart of an example method 1000 for operating an intermediary device that includes signal conditioner circuitry, level shifter circuitry, and state detector and controller circuitry. In one example, the method 1000 is performed by the intermediary device 106 described by reference to FIG. 1. In another example, the method 1000 is performed by the intermediary device 206 described by reference to FIG. 2. Moreover, in yet another example, method 1000 implements only a portion or some of the functionality or operability of an intermediary device according to the described examples, and method 1000 illustrates one example method of operation. For simplicity, method 1000 is described by reference to the example intermediary device 206, as described above by reference to FIGS. 2-8.

In accordance with the method 1000, the state detector and controller circuitry 210 receives signals from the bus 201 using one or more of the receivers 228-234 and operates the digital FSM 222, at block 1002, to detect a bus state or state of communications from the signals. In this example, the digital FSM 222 does not actively detect the low-speed or fullspeed data rates. Accordingly, at block 1004, the FSM 222 enables the level shifter circuitry 212 when the high-speed data rate has not been detected.

However, detecting the bus state includes detecting, from the signals received at the receiver circuitry, the high-speed (HS) data rate, at block 1006. If the FSM 224 does not detect the high-speed data rate, operation of the level shifter circuitry 212 continues, at block 1004. In an example, the level shifter circuitry is implemented and operated according to the example level shifter circuitry 312.

If the FSM 224 detects the high-speed data rate, the FSM 224 enables operation of the signal conditioner circuitry 208, at block 1008, the L1 circuitry 216, at block 1010, and the eSE1 circuitry at 1018. In an example, the signal conditioner circuitry is implemented and operated according to the example signal conditioner circuitry 408 and HS signal booster 520, the L1 circuitry is implemented and operated according to the example L1 circuitry 616, and the eSE1 circuitry is implemented and operated according to the example eSE1 circuitry 218. For example, operating the L1 circuitry 216 is for detecting a L1 state, at block 1012, and the eSE1 circuitry 218 is for detecting one or more eSE1 states, at block 1020. For instance, operating the L1 circuitry 216 includes generating clock signals, e.g., by the CDR circuit 600 using a respective synchronization (SYNC) pattern within packets communicated in the signals. Moreover, detecting the L1 state includes providing the clock signals to a finite state machine, e.g., FSM 622, and detecting indications of an EXT PID, a SUB PID, and an ACK PID in a succession of the packets, by the finite state machine, using the clock signals.

At block 1012, if the L1 state is detected, the intermediary device 206 operates in a low power state. The low power state includes at a minimum disabling the signal conditioner circuitry 208, at block 1026. However, in this example, the low power state includes the digital FSM 222 enabling the operation of the level shifter circuitry 212, at block 1014. The low power state continues until an L1 resume state is detected, at block 1016. When the L1 resume state is detected, the method 1000 enables the operations of the signal conditioner circuitry 208, at block 1010 and also disables the level shifter circuitry 212. Moreover, in some examples, when the L1 state is detected, the eSE1 circuitry 218 is also disabled.

Operating the eSE1 circuitry 218 is for detecting one or more eSE1 states from the signals, at block 1020. In an example, the eSE1 circuitry 218 can continue to operate until the start of an eSE1 state is detected, at block 1020, and until the end of the high-speed data rate is detected, at block 1024. Once detected, the digital FSM 222 disables operation of the signal conditioner circuitry 208, at block 1022, and enables operation of the level shifter circuitry 212, at block 1004. The method 1000 can continue with the operation of the digital FSM 222, to enable detection of the high-speed data rate, at block 1006. Upon the detection of the eSE1 state and the end of the high-speed data rate, at blocks 1020 and 1024, the digital FSM 222 can also disable the L1 circuitry 216 and the eSE1 circuitry 218.

In the description and in the claims, the terms "including" and "having" and variants thereof are intended to be inclusive in a manner similar to the term "comprising" unless otherwise noted. In addition, the terms "couple", "coupled" or "couples" means an indirect or direct electrical or mechanical connection. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While particular transistor structures are referred to above, other transistors or device structures may be used instead. For example, p-type MOSFETs may be used in place of n-type MOSFETs with little or no additional changes. In addition, other types of transistors (such as bipolar transistors—NPN or PNP) may be utilized in place of the transistors shown. The capacitors may be implemented using different device structures (such as metal structures formed over each other to form a parallel plate capacitor) or may be formed on layers (metal or doped semiconductors) closer to or farther from the semiconductor substrate surface.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described example, and other examples are possible, within the scope of the claims.

What is claimed is:

1. A circuit comprising:
signal conditioner circuitry;
level shifter circuitry; and
state detector and controller circuitry coupled between the signal conditioner circuitry and the level shifter circuitry and including:
receiver circuitry configured to detect signals; and
a finite state machine coupled to the receiver circuitry and configured to:
detect whether the signals have a first data rate or a second data rate:
control operation of the signal conditioner circuitry responsive to detecting the first data rate; and
control operation of the level shifter circuitry responsive to detecting the second data rate.

2. The circuit of claim 1, wherein the first data rate is a high-speed data rate, and the second data rate is a low-speed data rate or a full-speed data rate.

3. The circuit of claim 2, wherein:
the high-speed data rate is 480 megabits per second (Mb/s);
the full-speed data rate is 12 Mb/s; and
the low-speed data rate is 1.5 Mb/s.

4. The circuit of claim 1, wherein:
the finite state machine is a first finite state machine; and
the circuit further comprises low power state detection circuitry including:
a differential receiver;
a clock and data recovery (CDR) circuit coupled to the differential receiver; and
a second finite state machine coupled to the differential receiver and the CDR circuit and configured to detect a low power state from the signals using a clock signal generated by the CDR circuit.

5. The circuit of claim 4, wherein:
the CDR circuit is configured to generate the clock signal using a synchronization pattern of a packet communicated in the signals; and
the second finite state machine is configured to detect a link power management LPML1 state using a packet identifier of the packet.

6. The circuit of claim 1, wherein the signal conditioner circuitry is configured to boost edges of the signals.

7. A system comprising:
a first integrated circuit;
a second integrated circuit; and
an intermediary circuit coupled between the first and second integrated circuits, and including:
first switches;
signal conditioner circuitry configured to boost edges of signals during a state in which the first switches are closed;
second switches;
level shifter circuitry operable during a state in which the second switches are closed; and
state detector and controller circuitry including:
a finite state machine configured to:
detect a first data rate of the signals;

close the first switches responsive to detecting the first data rate; and close the second switches during a second data rate of the signals.

8. The system of claim 7, wherein the first integrated circuit is a first embedded Universal Serial Bus (eUSB2) device and the second integrated circuit is a second eUSB2 device.

9. The system of claim 7, wherein the first data rate is a high-speed data rate, and the second data rate is a low-speed data rate or a full-speed data rate.

10. The system of claim 7, wherein:

the finite state machine is a first finite state machine; and the intermediary circuit further comprising low power state detection circuitry including:

a differential receiver;

a clock and data recovery (CDR) circuit coupled to the differential receiver; and a second finite state machine coupled to the differential receiver and the CDR circuit and configured to detect a link power management LPM-L1 (L1) state from the signals using a clock signal generated by the CDR circuit.

11. The system of claim 10, wherein:

the CDR circuit is configured to generate the clock signal using a synchronization pattern of a packet communicated in the signals; and the second finite state machine is configured to detect the L1 state using a packet identifier of the packet.

12. A method comprising:

receiving signals;

detecting whether the signals have a first data rate or a second data rate;

operating signal conditioner circuitry responsive to detecting the first data rate, to boost edges of the signals; and operating level shifter circuitry responsive to detecting the second data rate, to shift a voltage level of the signals from a first voltage level to a second voltage level.

13. The method of claim 12, wherein the first data rate is a high-speed data rate, and the second data rate is a low-speed data rate or a full-speed data rate.

14. The method of claim 12, further comprising operating low power mode detection circuitry responsive to detecting the second data rate, for detecting a link power management LPM-L1 (L1) state from the signals.

15. The method of claim 14, wherein operating the low power mode detection circuitry includes generating clock signals using a respective synchronization (SYNC) pattern within packets communicated in the signals.

16. The method of claim 15, wherein detecting the L1 state includes:

providing the clock signals to a finite state machine; and detecting an EXT packet identifier (PID), a SUB PID, and an ACK PID in a succession of the packets, by the finite state machine, using the clock signals.

17. The method of claim 12, further comprising detecting an embedded Universal Serial Bus single ended one (ESE1) state from the signals.

18. An intermediary circuit adapted to be coupled between first and second communication devices using first and second conductors and operable to facilitate communications between the first and second communication devices, the intermediary circuit comprising:

a state detector and controller circuit having first and second outputs and adapted to be coupled to the first and second conductors;

a signal conditioning circuit coupled to the first output and adapted to be coupled to the first and second conductors, wherein the signal conditioning circuit is adapted to receive a first enable signal through the first output of the state detector and controller circuit; and a level shifter coupled to the second output and adapted to be coupled to the first and second conductors, wherein the level shifter is adapted to receive a second enable signal through the second output of the state detector and controller circuit.

19. The intermediary circuit of claim 18, wherein the state detector and controller circuit is configured to:

detect a state of communication;

enable the signal conditioning circuit responsive to detecting a first state of communication; and enable the level shifter during a second state of communication.

20. The intermediary circuit of claim 19, wherein the first state of communication is a high-speed data rate, and the second state of communication is a low-speed data rate or a full-speed data rate.

21. The intermediary circuit of claim 18, wherein the signal conditioning circuit is configured to boost edges of signals on the first and second conductors.

22. The intermediary circuit of claim 18, wherein the level shifter is configured to shift voltage levels of signals on the first and second conductors.

* * * * *